United States Patent [19]

Schaake et al.

[11] Patent Number: 4,481,044

[45] Date of Patent: Nov. 6, 1984

[54] HIGH-TEMPERATURE HG ANNEAL FOR HGCDTE

[75] Inventors: Herbert F. Schaake, Denton; John H. Tregilgas, Richardson, both of Tex.

[73] Assignee: Texas Instruments Incorporated, Dallas, Tex.

[21] Appl. No.: 591,903

[22] Filed: Mar. 21, 1984

Related U.S. Application Data

[63] Continuation of Ser. No. 444,903, Nov. 29, 1982, abandoned.

[51] Int. Cl.³ .................................................. C21D 1/74
[52] U.S. Cl. ..................................... 148/20.3; 148/1.5
[58] Field of Search .................... 148/13.1, 20.3, 1.5

[56] References Cited

U.S. PATENT DOCUMENTS

| | | | |
|---|---|---|---|
| 3,723,190 | 3/1973 | Kruse et al. | 148/1.5 |
| 3,954,518 | 5/1976 | Schmit et al. | 148/20.3 |
| 3,963,540 | 6/1976 | Camp, Jr. et al. | 148/20.3 |
| 3,979,232 | 9/1976 | Hager et al. | 148/20.3 |
| 4,028,145 | 6/1977 | Kasenga | 148/20.3 |
| 4,116,725 | 9/1978 | Shimuzu | 148/20.3 |
| 4,374,684 | 2/1983 | Micklethwaite | 148/13.1 |

Primary Examiner—L. Dewayne Rutledge
Assistant Examiner—Christopher W. Brody
Attorney, Agent, or Firm—Robert Groover; James T. Comfort; Melvin Sharp

[57] ABSTRACT

The dislocation density near the surface of $Hg_{1-x}Cd_xTe$ alloys is substantially reduced by annealing the material at around 600° C. in a mercury saturated ambient for periods of four hours or more, prior to post annealing at lower temperatures to control the metal vacancy concentration. This procedure allows dislocation reduction by climb, reduces the concentration of metal vacancies which can collapse to form dislocation loops or contribute to dislocation multiplication, and reduces tellurium precipitates which contribute to dislocation multiplication during subsequent post annealing.

5 Claims, 2 Drawing Figures

HIGH-TEMPERATURE HG ANNEAL FOR HGCDTE

This application is a continuation of application Ser. No. 444,903, filed Nov. 29, 1982, now abandoned.

BACKGROUND AND SUMMARY OF THE INVENTION

The present invention relates to preparation of semiconductor alloys of the formula $Hg_{1-x}Cd_xTe_1$ generically referred to as "HgCdTe". Such alloys are needed for infrared detectors. The materials requirements of such applications are:

(1) compositional uniformity, i.e. constant value of the alloying parameter x; (2) low concentration of impurities (ideally less than $10^{14}/cm^3$); and (3) good crystal quality (low density of vacancies and of dislocations).

Heretofore, there has been little effort to reduce or control dislocation density of $Hg_{1-x}Cd_xTe$. Bulk material grown by the quench anneal or solid state recrystallization process typically exhibits dislocation densities in the range of $10^5$–$10^7$ cm/cm$^3$, while epitaxial materials can show similar or slightly lower densities. The as-grown material usually includes an excess of Te (typically very much less than 1% atomic), and generally exhibits a high concentration of metal vacancies, the concentration of which is controlled by annealing under Hg saturated conditions usually below about 300° C. The annealing process as presently practiced throughout the industry can actually increase the dislocation density by about a factor of ten.

A major difficulty in the prior art preparation of HgCdTe can be seen in the phase diagram of FIG. 1, which shows the prior art process. (The pseudo-binary phase diagram is slightly sensitive to the Hg:Cd ratio, but the Schematic diagrams of FIGS. 1 and 2 are fairly accurate for the HgCdTe compositions of primary interest, viz. 4 to 12 micron material.) That is, the as-compounded material is recrystallized at a fairly high temperature $T_1$. This solid state recrystallization process is well known, and is shown, for example, in vol. 18, pp. 48–119, of *Semiconductors and Semimetals*. As is well known in the art, the recrystallization process should take place at a temperature $T_1$ which is between 600° and the melting point of the solid, which is approximately 680° C. The recrystallization step requires a fairly long time, preferably forty hours or more. This recrystallization step homogenizes the material, that is the compositional parameter "x" in the alloy $Hg_{1-x}Cd_xTe$ becomes uniform throughout the material.

After this recrystallization step, the HgCdTe material, which is now compositionally uniform, is conventionally cooled to room temperature, where the ingot is sliced into bars whose physical dimensions approximate those of the final material used for device fabrication. These bars are then heated to a lower temperature $T_2$ for a so-called post anneal step in mercury vapor. The temperature $T_2$ is typically 300° or less, and annealing at this temperature is performed, in the prior art, for a time of at least an hour (and typically much longer) in an ampoule containing some liquid mercury. This post anneal step approximately restores the HgCdTe material to stoichiometry, which is shown in the phase diagram of FIG. 1 by the vertical dotted line at 50 atomic percent on the composition axis.

However, the chief difficulty of this process can also be seen from FIG. 1. That is, when the material is cooled down from the recrystallization temperature $T_1$, it moves from the single phase region, where the desired HgCdTe crystalline structure is found, into a two-phase region, where precipitates of tellurium are also present in the HgCdTe matrix. Since tellurium is highly immobile in HgCdTe, these tellurium precipitates are a source of trouble. That is, during the post anneal stage, when the composition of the material is changed at a constant temperature $T_2$, the mercury which must indiffuse to effect the necessary compositional change, will combine with the precipitated tellurium.

However, this causes a substantial multiplication of existing dislocations in the matrix lattice, reducing the resulting crystal quality. Additional background is found in Anderson et al., "Precipitation and Phase Stability of (Hg,Cd)Te", 21 J. Vac. Sci. Technol. 125 (1982), which is hereby incorporated by reference.

The method of the present invention teaches annealing slices of $Hg_{1-x}Cd_xTe$ under a mercury saturated ambient, at temperatures (e.g. 600° C.) where dislocation motion can occur by climb, for a period sufficient to allow the depletion of dislocations adjacent to the surface and to allow excess tellurium present to be removed by the indiffusion of mercury. For example, at 600° C. about four hours are required to minimize the dislocation density near the surface. Followiing this treatment the slices can be post annealed under saturated mercury conditions below 300° C., without inducing dislocation multiplication which is normally encountered without use of this invention.

According to the present invention there is provided: a method for preparation of approximately stoichiometric alloys of (Hg,Cd)Te having a preselected proportion of mercury to cadmium, comprising the steps of: providing a bulk alloy of mercury, cadmium, and tellurium, said bulk alloy containing an excess of tellurium over said predetermined composition; annealing said bulk alloy, at an intermediate temperature which is greater than 350° C. and less than the melting point of said bulk alloy, in an overpressure of mercury, whereby the composition of said bulk alloy is converted to an intermediate alloy having a smaller excess of tellurium.

BRIEF DESCRIPTION OF THE DRAWINGS

The present invention will be described with reference to the accompanying drawings, wherein.

DESCRIPTION OF THE PREFERRED EMBODIMENTS

Figure 1:
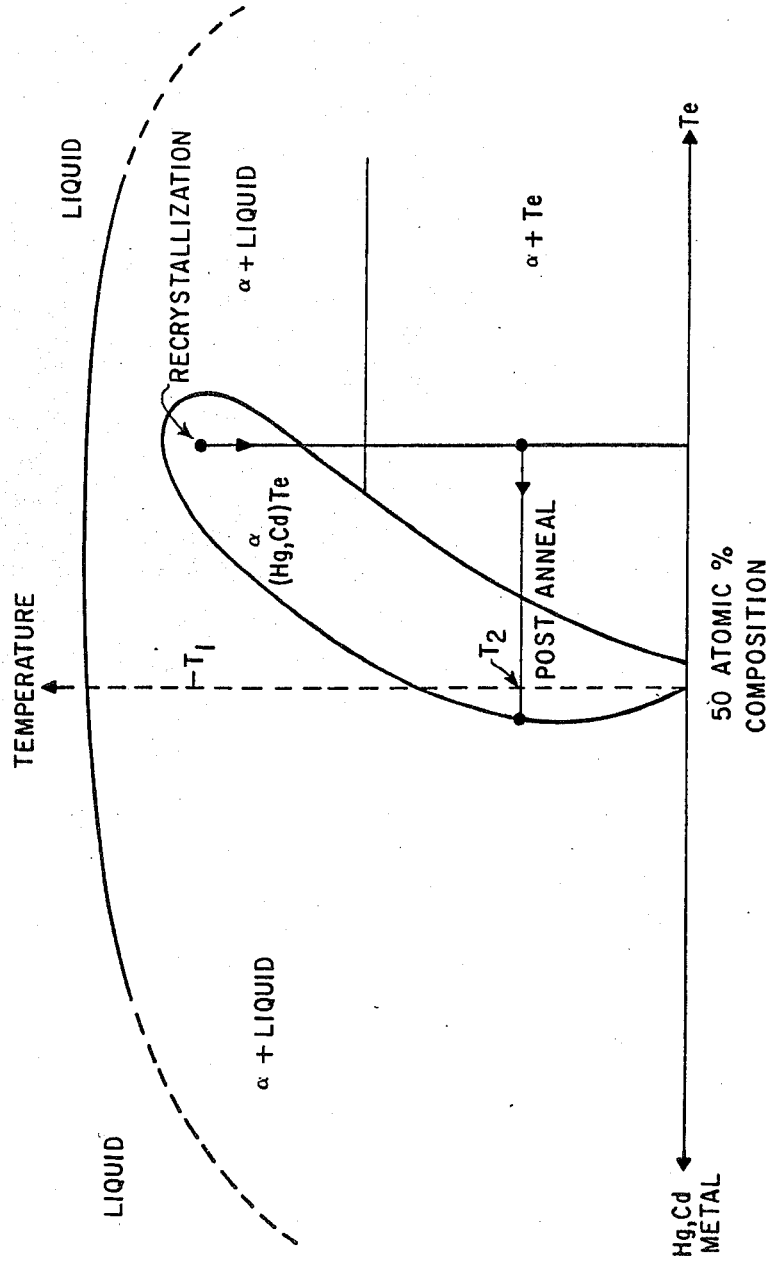
FIG. 1 shows, on a schematic phase diagram of the HgCdTe pseudo-binary system, the prior art process for preparation of HgCdTe device material.

Techniques for growing $Hg_{1-x}Cd_xTe$ have been previously described. W. F. H. Micklethwaite in *Semiconductors and Semimetals*, R. K. Willardson nd A. C. Beer, eds., Vol. 18, 1981, pp. 48-119; which is hereby incorporated by reference. The standard bulk recrystallization process is schematically represented in FIG. 1, and its process involves the following steps:

1. Reaction of (compounding of) the pure elements in a quartz ampoule.

2. Annealing this ampoule at $T_1$ (FIG. 1), where 600° C. is less than $T_1$ is less than the melting point of the solid, in order to recrystallize and/or homogenize the ingot.

3. Slicing the ingot into bars.

4. Adjusting stoichiometry by post annealing at $T_2$ in Hg vapor ($T_2$ approximately 300° C.).

Figure 2:
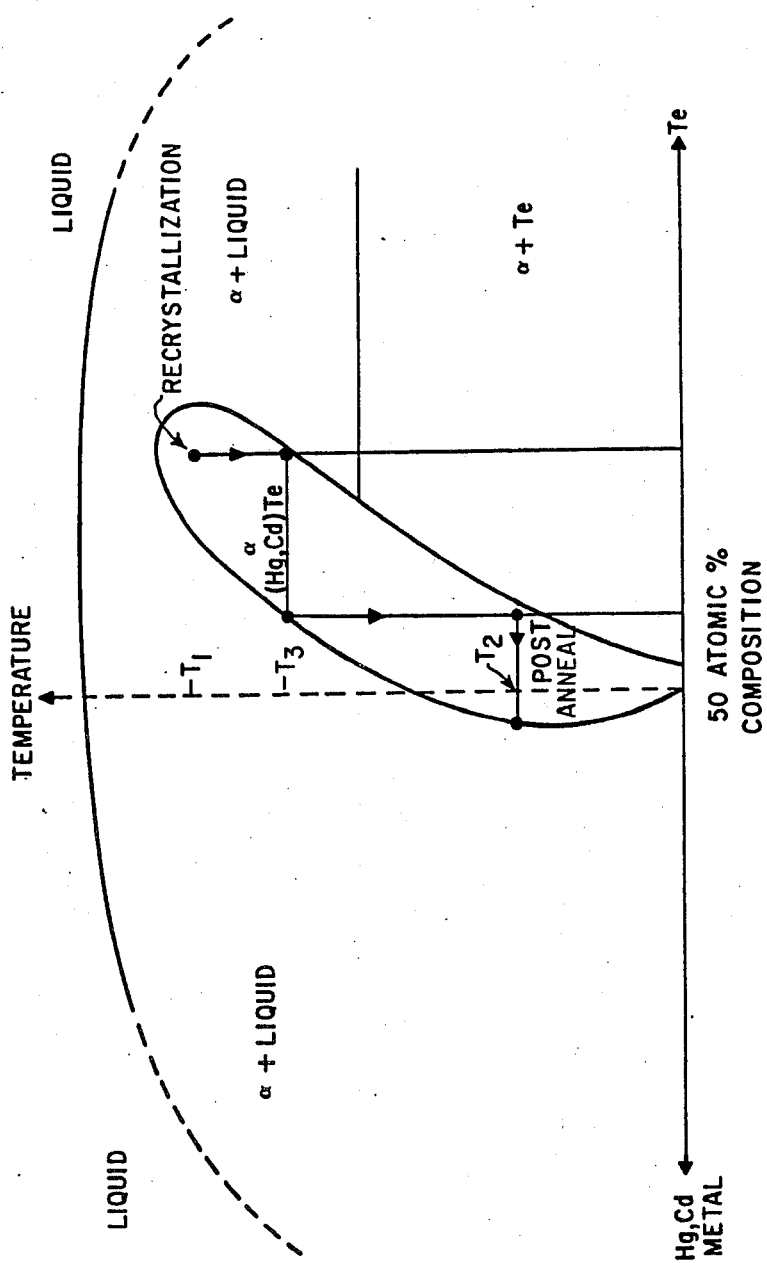
FIG. 2 shows, on a schematic phase diagram of the HgCdTe pseudo-binary system, the steps used in practicing the invention.

The inventive modified process shown in FIG. 2 is employed to reduce or eliminate second phase Te normally present at the post anneal temperature. The $Hg_{1-x}Cd_xTe$ is subjected to an intermediate anneal at $T_3$ (FIG. 2) where $T_2$ is less than $T_3$ is less than $T_1$. This intermediate anneal can be done in either slice or ingot form, but it is most effective when slices are used. The required minimum duration of the intermediate anneal is determined by $T_3$ and the Hg vapor pressure. For example, about four hours at 600 C. under saturated Hg vapor is required. Lower temperatures can be used, but longer annealing times will be required. There is no maximum duration on the intermediate temperature anneal, since the composition stabilizes at the mercury-rich phase border of the single-phase region.

This process has been described for bulk recrystallized material, but it is also applicable to material grown by liquid phase epitaxy, vapor phase epitaxy, zone melting, slush growth, Czochralski growth, or Bridgman growth.

The method of the present invention has been demonstrated for $Hg_{1-x}Cd_xTe$ alloys where the value of x ranges from 0.2 to 0.3, but is also applicable to shorter and to longer wavelength material. While the invention can be applied to material in any starting condition, it produces the best results with material formed by the quench-anneal or solid state recrystallization process when used between a high temperature (around 600° C.) recrystallization anneal and the low temperature (around 300° C.) post anneal in a saturated Hg ambient.

The method as it has been applied uses recrystallized slices of $Hg_{1-x}Cd_xTe$ which have been chemically etched in a solution of bromine and methanol for sufficient time to remove surface damage introduced by cutting. These slices are then encapsulated in a quartz tube with sufficient Hg to provide a saturated Hg atmosphere at the 600° C. dislocation reduction annealing temperature. The encapsulated slices are then placed into a furnace at 600° C. and held for at least four hours. The encapsulated slices can then be removed from the 600° C. furnace and placed directly into a low temperature post anneal below 325° C. to adjust the carrier concentration. (It is also possible to permit the material to cool to room temperature before the post anneal.) Material which has been subjected to the previously described dislocation reduction anneal at 600° C. will not exhibit dislocation multiplication upon post anneal at lower temperatures. Since the post anneal after the intermediate anneal of the present invention does not have to remove Te precipitation, it requires much less time than in the prior art. That is, the post anneal for material prepared according to the present invention typically requires several hours to several days, as compared to several days to several weeks or more in prior art processes. The exact post anneal time used is dependent on the desired skin depth (depth of the nearly stoichiometric device-quality material) and (in prior art methods) on the exact starting material composition.

The key requirements for implementation of this invention are: preferably a short dislocation diffusion path to a free surface (i.e. samples should preferably be in slice form or epitaxial thin films); a high temperature dislocation reduction annealing treatment between 350° C. and the melting point of the material, in a saturated Hg ambient; and sufficient annealing time to permit both dislocation reduction and a compositional alteration of the sample surface so as to reduce or eliminate the formation of second phase Te upon cooling to room temperature.

It will be obvious to those skilled in the art that numerous modifications and variations can be introduced in the method of the invention, which is not limited except as specified on the following claims.

What is claimed is:

1. A method for preparation of approximately stoichiometric alloys of (Hg, Cd) Te having a preselected proportion of mercury to cadmium, comprising the steps of:
   providing a bulk alloy of mercury, cadmium, and tellurium, said bulk alloy containing an excess of tellurium over said predetermined composition;
   annealing said bulk alloy, at an intermediate temperature which is greater than 350° C. and less than the melting point of said bulk alloy, in a saturated atmosphere of mercury, whereby the composition of said bulk alloy is converted to an intermediate alloy having a smaller excess of tellurium; and subsequently
   annealing said intermediate alloy at a second temperature, said second temperature being less than 325° C., to compositionally adjust said intermediate alloy to achieve a desired carrier concentration.

2. The process of claim 1, wherein a bulk recrystallization anneal is performed on an ingot to produce said bulk alloy, and wherein said ingot is sliced into wafers prior to said intermediate-temperature anneal.

3. The process of claim 2, wherein said wafers are etched to remove surface damage after said slicing step and prior to said intermediate-temperature anneal step.

4. The process of claim 3 wherein said intermediate temperature anneal is performed for at least 4 hours.

5. The process of claim 3, wherein said intermediate temperature anneal is performed at a temperature in the neighborhood of 600° C.

* * * * *